United States Patent
Jeunink et al.

(10) Patent No.: US 12,443,115 B2
(45) Date of Patent: Oct. 14, 2025

(54) MEASUREMENT SYSTEM AND METHOD FOR CHARACTERIZING A PATTERNING DEVICE

(71) Applicant: ASML Netherlands B.V., Veldhoven (NL)

(72) Inventors: Andre Bernardus Jeunink, De Lutte (NL); Erik Henricus Egidius Catharina Eummelen, Veldhoven (NL); Bearrach Moest, Eindhoven (NL); Derk Onck, Leende (NL); Johannes Adrianus Cornelis Maria Pijnenburg, Moergestel (NL); Hermen Folken Pen, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 646 days.

(21) Appl. No.: 17/766,049

(22) PCT Filed: Sep. 7, 2020

(86) PCT No.: PCT/EP2020/074969
§ 371 (c)(1),
(2) Date: Apr. 1, 2022

(87) PCT Pub. No.: WO2021/063635
PCT Pub. Date: Apr. 8, 2021

(65) Prior Publication Data
US 2022/0373894 A1    Nov. 24, 2022

(30) Foreign Application Priority Data
Oct. 3, 2019 (EP) ..................................... 19201296

(51) Int. Cl.
*G03F 7/00* (2006.01)
*G03F 1/84* (2012.01)

(52) U.S. Cl.
CPC .............. *G03F 7/7085* (2013.01); *G03F 1/84* (2013.01); *G03F 7/70875* (2013.01)

(58) Field of Classification Search
CPC .............. G03F 7/7085; G03F 7/70625; G03F 7/70875; G03F 1/68; G03F 1/82;
(Continued)

(56) References Cited

U.S. PATENT DOCUMENTS

| | | |
|---|---|---|
| 6,952,253 B2 | 10/2005 | Lof et al. |
| 8,962,223 B2 | 2/2015 | Sasaki et al. |

(Continued)

FOREIGN PATENT DOCUMENTS

| | | |
|---|---|---|
| CN | 102187275 A | 9/2011 |
| CN | 104020643 A | 9/2014 |

(Continued)

OTHER PUBLICATIONS

English translation of JP2005-221451, published Aug. 18, 2005. (Year: 2005).*

(Continued)

*Primary Examiner* — Christina A Riddle
(74) *Attorney, Agent, or Firm* — Sterne, Kessler, Goldstein &Fox P.L.L.C.

(57) ABSTRACT

A method is provided for determining surface parameters of a patterning device, comprising the steps of: positioning the patterning device with respect to a path of an exposure radiation beam using a first measurement system, providing the patterning device at a first focal plane of a chromatic lens arranged in a second measurement system, illuminating a part of a surface of the patterning device with radiation through the chromatic lens, wherein the radiation comprises a plurality of wavelengths, determining a position of the illuminated part of the patterning device in a first and second direction, collecting at least a portion of radiation reflected (Continued)

by the patterning device through the chromatic lens, measuring an intensity of the collected portion of radiation as a function of wavelength, to obtain spectral information of the illuminated area, and determining the surface parameters of the patterning device at the determined position from the spectral information.

15 Claims, 8 Drawing Sheets

(58) Field of Classification Search
CPC .... G03F 1/84; G03F 7/70216; G03F 7/70258; G03F 7/70266; G03F 7/70283; G03F 7/703; G03F 7/70308; G03F 7/70316; G03F 7/70566; G03F 7/70575; G03F 7/70483–70541; G03F 7/7055; G03F 7/70591; G03F 7/706; G03F 7/70605–706851; G03F 7/70691; G03F 7/70716; G03F 7/70783; G03F 7/708; G03F 7/70808; G03F 7/70825; G03F 7/70833; G03F 7/70858; G03F 7/70866; G03F 7/70883; G03F 7/70908; G03F 7/70941; G03F 7/70958; G03F 7/70966; G03F 7/70975; G03F 7/70991
USPC .......... 355/18, 30, 41, 42, 46, 52–55, 67–77
See application file for complete search history.

(56) References Cited

U.S. PATENT DOCUMENTS

| | | |
|---|---|---|
| 10,591,279 B2 | 3/2020 | Reolon et al. |
| 10,928,332 B2 | 2/2021 | Holger et al. |
| 2003/0173529 A1 | 9/2003 | Hoshino |
| 2007/0285632 A1 | 12/2007 | Phillips et al. |
| 2008/0034602 A1 | 2/2008 | Schwarz |
| 2009/0246644 A1 | 10/2009 | Wu |
| 2009/0323039 A1* | 12/2009 | Wardenier .......... G03F 7/70666 355/77 |
| 2011/0181851 A1 | 7/2011 | Schoeppach et al. |
| 2013/0135715 A1* | 5/2013 | Chen ..................... G02B 21/06 359/385 |
| 2015/0292865 A1 | 10/2015 | Nomaru |
| 2016/0138907 A1 | 5/2016 | Budach et al. |
| 2016/0377995 A1 | 12/2016 | Gilles et al. |
| 2018/0095369 A1 | 4/2018 | Van De Ruit et al. |
| 2018/0364561 A1 | 12/2018 | Ferdinand et al. |
| 2021/0200077 A1 | 7/2021 | Chen et al. |

FOREIGN PATENT DOCUMENTS

| | | | |
|---|---|---|---|
| CN | 104976955 A | 10/2015 | |
| CN | 105829971 A | 8/2016 | |
| CN | 107209356 A | 9/2017 | |
| JP | H 11-045846 A | 2/1999 | |
| JP | 2003-270773 A | 9/2003 | |
| JP | 2005221451 A * | 8/2005 | |
| JP | 2006-279029 A | 10/2006 | |
| JP | 2010-217113 A | 9/2010 | |
| JP | 2012-093197 A | 5/2012 | |
| JP | 2014-006314 A | 1/2014 | |
| JP | 2016-127226 A | 7/2016 | |
| JP | 2019-090836 A | 6/2019 | |
| TW | 201908863 A | 3/2019 | |
| WO | WO-2017102380 A1 * | 6/2017 | ............... G03F 1/22 |
| WO | WO 2017/153085 A1 | 9/2017 | |

OTHER PUBLICATIONS

International Search Report and Written Opinion of the International Searching Authority directed to related International Patent Application No. PCT/EP2020/074969, mailed Dec. 17, 2020, 12 pages.

International Preliminary Report on Patentability directed to related International Patent Application No. PCT/EP2020/074969, issued Apr. 5, 2022, 9 pages.

* cited by examiner

MEASUREMENT SYSTEM AND METHOD FOR CHARACTERIZING A PATTERNING DEVICE

CROSS-REFERENCE TO RELATED APPLICATIONS

This application claims priority of EP application 19201296.1 which was filed on 3 Oct. 2019, and which is incorporated herein in its entirety by reference.

FIELD

The present invention relates to a measurement system and method for characterizing a patterning device, and specially for measuring geometric properties and surface properties of the patterning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm, and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

It is desirable to provide accurate control over the pattern that is delivered to a substrate within a lithographic apparatus, in order to meet requirements regarding critical dimension uniformity and overlay. This control is not limited to the pattern as provided on the patterning device, or the projection system (for example lenses and or mirrors), but this control may also be related to the shape of the patterning device itself. That is, the surface flatness of the patterning device may impact the pattern that is projected to the substrate. Although sensors arranged at a stage, for example a wafer stage or a measurement stage, may be used to obtain position information of the patterning device, the position information is typically limited by measurements performed close to the four edges of the patterning device. To improve the accurate control over the pattern, surface position information within an exposure field of the patterning device is required, which may not be obtained in-situ with current sensors or methods. Shape information within the exposure field of a patterning device, or patterned area of the patterning device, may be obtained by means of interferometric measurement systems as described in WO2017/153085A1. However, these type of interferometric measurement systems have the disadvantage of being sensitive to environmental variations, which in turn may result in fault measurement results.

It is an object of the invention to provide an apparatus and a method for characterizing a patterning device that overcome the limitations as mentioned above.

SUMMARY

It is an object of the invention to provide a measurement system and a method for characterizing a patterning device. The measurement system is configured for measuring geometric and surface properties of the patterning device.

This object is achieved with a method for determining surface parameters of a patterning device. The method comprising the steps of: loading the patterning device onto a mask support, that is arranged in a lithographic apparatus, positioning the patterning device with respect to a path of an exposure radiation beam using a first measurement system, providing the patterning device at a first focal plane of a chromatic lens, arranged in a second measurement system, providing the patterning device at a first focal plane of a chromatic lens, illuminating a part of a surface of the patterning device with radiation through the chromatic lens, said radiation comprising a plurality of wavelengths, determining a position of the illuminated part in a first direction and a second direction, collecting at least a portion of radiation reflected by the patterning device through the chromatic lens, measuring at a second focal plane or the chromatic lens an intensity of the collected portion of radiation as a function of wavelength, to obtain spectral information, and determining the surface parameters of the patterning device at the determined position from the spectral information. Positioning (or aligning) the patterning device is to prepare the patterning device for exposure of a substrate. By providing the patterning device the first focal plane of the chromatic lens and by measuring at the second focal plane the radiation that is reflected at the first focal plane, only radiation that was focused by the chromatic lens at the target will be recorded. That is, a chromatic lens may provide a strong chromatic aberration to radiation that interacts with the chromatic lens. This has the advantage that radiation comprising different wavelengths is focused at different distances (or different focal planes) of the chromatic lens. This gives the advantage that the chromatic lens does not have to move to ensure that the focus position of radiation comprising a plurality of wavelengths is at the surface or interface of the patterning device.

In accordance with the invention, the method is repeated a plurality of times, wherein a different part of the surface of the patterning device is illuminated for each repetition. This may be achieved by moving the patterning device relatively to the chromatic lens in at least the first or second direction. Herewith, the patterning device may be scanned in one or more directions. Based on the received spectral information as a function of the position of the patterning device during scan-movement, spatial information of the patterning device may be obtained. A surface parameter map may be determined from the information collected during the scan.

The surface parameter as recorded may be governed by the optical properties of the surface. Hence, the surface parameter may therefore be a measure of an optical property of the illuminated portion (part or area) of the patterning device. In accordance with the invention, the method may be used to determine at least an optical property, for example transmissivity, reflectivity and or absorption, of the patterning device.

The invention further provides a method for determining an expected heating effect of the patterning device by using a heating model, with the optical property as an input. The heating model may be a reticle heating model and or a lens heating model. The optical properties may be used to derive the amount of radiation absorbed by the patterning device during an exposure sequence within a lithographic process. The absorption depends on the local properties of the patterning device. Based on the amount of absorbed radiation, a model (for example, a finite element model) may be used to derive the (expected) heat load at the patterning device. The heat load may induce shape and or optical changes of the patterning device.

In accordance with the invention, the method may be used to determine an axial distance between the illuminated part at the patterning device and the chromatic lens. Due to the chromatic behaviour of the lens, the wavelength can be used as a ruler for measuring a distance between the chromatic lens and the surface of the patterning device. Thus, by determining the wavelength of the collected and measured radiation also the information of the axial distance (in a third direction) may be obtained.

The invention further provides a method to determine a shape of the patterning device from the axial distance. By measuring the axial distance as a function of spatial position, for example as a function of a position within a two-dimensional plane preferably in a plane approximately parallel to the surface of the patterning device, a height map or surface topography map of the patterning device may be obtained. From this map, a local and or global shape of the patterning device may be determined.

In accordance with the invention the method may further be used for patterning device shape compensation. The method further comprises adjusting at least one of the position of the patterning device, by applying a translation to the patterning device, and the orientation of the patterning device, by applying a rotation to the patterning device, based on the determined shape of the patterning device. The translation of the patterning device may be along the z-direction. The rotation of the patterning device may be an Rx rotation and or an Ry rotation.

The shape compensation may also be accomplished by adjusting the shape of the patterning device based on the determined shape by applying a mechanical load to the patterning device.

In accordance with the invention, a method for compensating a heating effect of the patterning device is provided. The method further comprises the steps of: calculating an expected shape change of the patterning device based on the determined surface parameter map and an exposure setting to be used for an exposure of a substrate, to determine an expected heating effect of the patterning device, defining (lens) settings of a projection lens by means of a lens model to compensate the expected shape change of the patterning device, and applying the defined settings before and or during the exposure. The heating effects may comprise optical aberrations. That is, optical elements (transmissive and reflective elements) within the projection lens are typically configured to be adjusted. Herewith, optical aberrations within the optical path may be changed or compensated by adjusting one or more settings of the optical elements. This may be done via position and or orientation changes of these elements, or by changing the refractive index of the transmissive element.

The invention further comprises a method of imaging a pattern, provided at a patterning device, via projection system onto a substrate under control of data representative of a surface topography map of the patterning device according to a method used to determine the shape of the patterning device.

In an embodiment, a lithographic apparatus comprises a measurement system for characterizing a patterning device, with the measurement system comprising a radiation source arranged to provide radiation with a plurality of wavelengths, at least one chromatic lens, arranged in at least one chromatic confocal sensor, configured to illuminate an area of the patterning device with the provided radiation, and wherein the at least one chromatic lens is configured to collect at least a portion of the radiation reflected by the patterning device provided at a first focal plane of the at least one chromatic lens, a detector arranged at a second focal plane of the at least one chromatic lens, wherein the detector is configured to detect at least a portion of the collected radiation and to provide an intensity signal as a function of wavelength in response to the detected radiation, and a processor to determine characteristics of the patterning device at the illuminated area. The chromatic lens may provide a strong chromatic aberration to radiation that interacts with the chromatic lens. This has the advantage that radiation comprising different wavelengths is focused at different distances (or different focal planes) of the chromatic lens. This gives the advantage that the chromatic lens does not have to move to ensure that the focus position of radiation comprising a plurality of wavelengths is at the surface or interface of the patterning device. Herewith, a patterning device provided in the lithographic apparatus can be characterised in-situ. Measurement and characterization may be done before and or during an wafer exposure sequence. This has the advantage that the patterning device can be monitored at real time. The measurement results may be used directly in order to compensate parameter changes of the patterning device as a result of the exposure steps. This may include shape changes as well as optical changes, for example induced by the heat load of impinging radiation used for exposure.

The detector may be a spectrometer arranged to obtain spectral information for radiation detected by the detector.

A plurality of chromatic confocal sensors may be arranged to form an array of sensors. Herewith, a plurality of positions or areas may be measured at the same time.

The characteristics of the patterning device is at least one of an axial distance between the patterning device and the chromatic lens, and an optical property. By using the measurement system according to the invention, a distance between the chromatic lens arranged in a chromatic confocal sensor and a patterning device may be determined based on the intensity signal as a function of wavelength. The wavelength can be used as a measure of an axial distance. The optical properties may be transmissivity, reflectivity, and or absorption of the patterning device at the illuminated area. This has the advantage that not only the shape of the patterning device can be measured, but also the (local and or global) optical characteristics can be determined.

In an embodiment of the invention, multiple wavelength radiation (or radiation with a plurality of wavelengths) is provided by a radiation source comprising a broadband radiation source or a plurality of radiation sources. A measurement system provided with radiation from a broadband radiation source has the advantage that a single radiation source is used to provide radiation of multiple wavelengths.

Thus, only control over one radiation source is required. Using a plurality of radiation sources may be cost beneficial.

According to an embodiment, the measurement system may be provided at a lens top within a lithographic apparatus. The measurement system may also be provide at a frame near a support constructed to support a patterning device.

According to an embodiment, the measurement system may be arranged in an inspection apparatus. The inspection apparatus may be configured to inspect and or to qualify patterning devices. Information obtained in the inspection apparatus, may be provided to another system, for example a lithographic apparatus or an apparatus arranged to manufacture patterning devices.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g., with a wavelength of 365, 248, 193, 157, or 126 nm) and EUV (extreme ultra-violet radiation, e.g., having a wavelength in the range of about 5-100 nm).

The term "reticle", "mask", or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
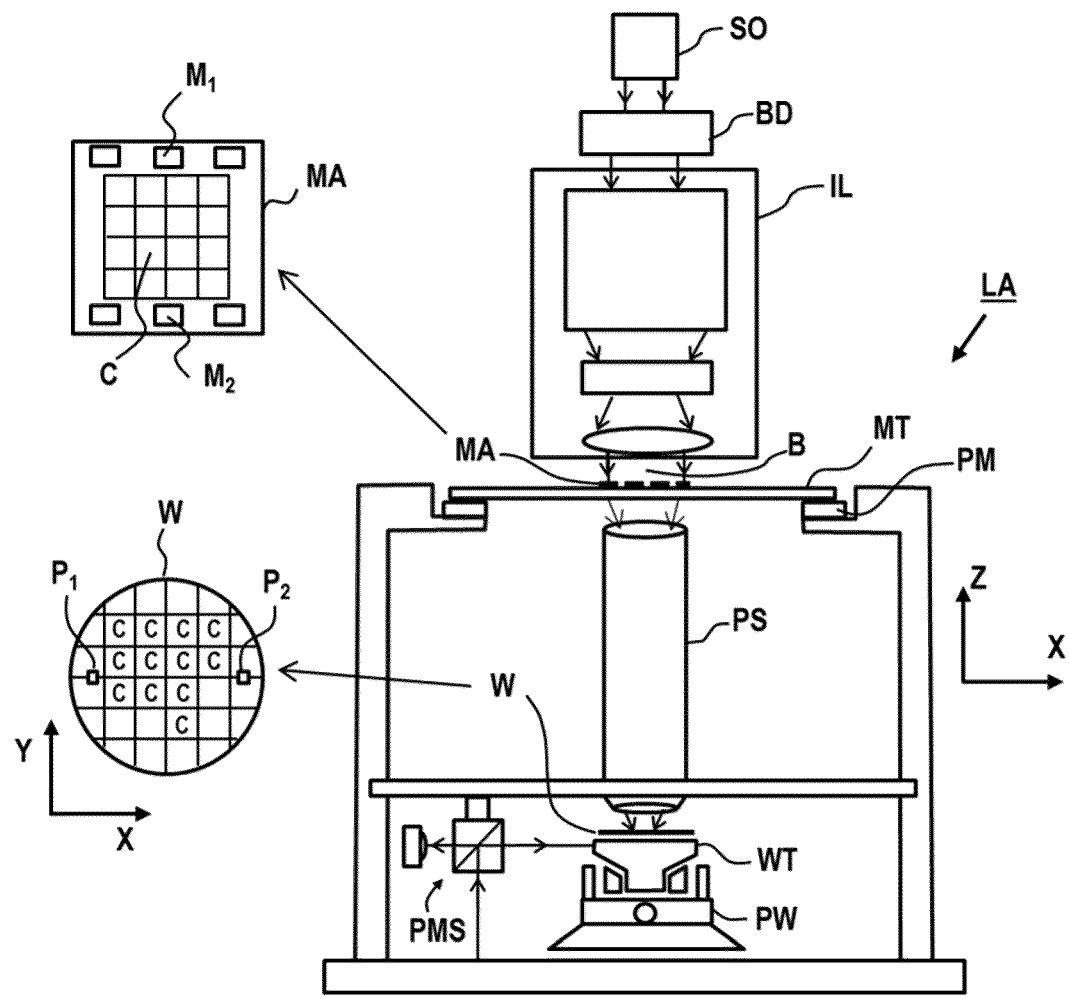
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g., via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the (exposure) radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis, and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. The orientation of the Cartesian coordinate system may be different, for example, such that the z-axis has a component along the horizontal plane.

In known lithographic apparatus and methods, lithographic errors may occur that affect important parameters (e.g., critical dimension uniformity or overlay) of the lithographic process. One of the causes is the unflatness of the patterning device MA. That is, the surface of the patterning device MA may be (locally) curved or tilted due to the interaction with the supporting stage (or mask support T), due to gravity, and or due to reaction forces acting on the patterning device MA during operational use of the lithographic apparatus LA. In addition, the shape or the surface of the patterning device MA may change during exposure of a wafer lot. It will be appreciated by the skilled person that obtaining information of the patterning device MA, and especially surface position information, may advantageous for limiting lithographic errors.

Figure 2A:
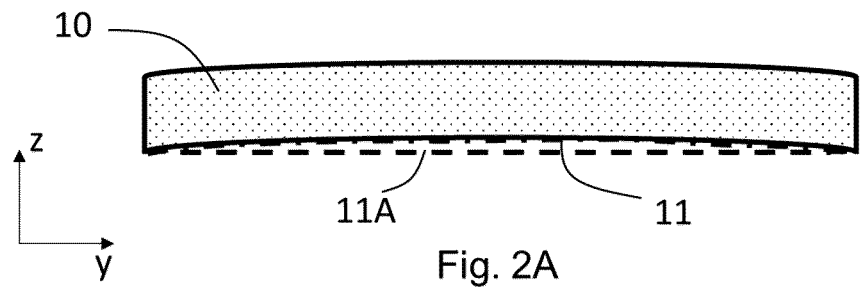
FIG. 2A illustrates a non-flat patterning device.
Figure 2B:
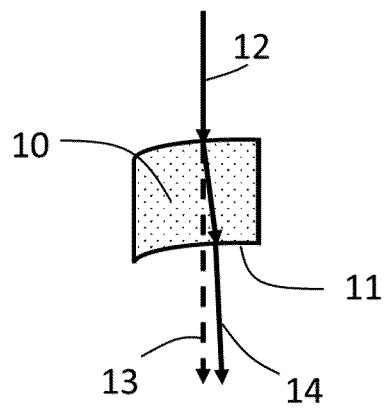
FIGS. 2B and 2C illustrate interaction of exposure radiation with a non-flat transmissive and a non-flat reflective patterning device, respectively.
Figure 2C:
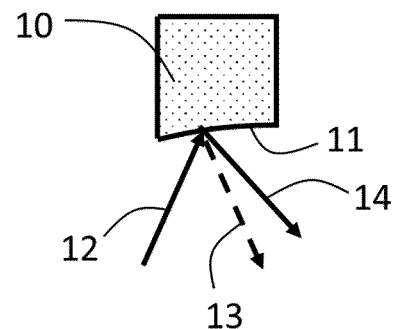

FIG. 2A illustrates the problem addressed by the invention. A surface 11 of a patterning device 10, which may be provided with a pattern, deviates from a (virtual) plane surface 11A as indicatively illustrated by the dashed line, representing a flat surface in the xy-plane. The deviation (or deformation), as illustrated in FIGS. 2A, 2B, and 2C, is exaggerated to illustrate the effect. In practice, the deviation may be in the range of nanometres or (sub)micrometres. In the situation as presented by FIG. 2A, the patterned surface 11 has a so-called concave shape that may be caused by the supporting stage T, for example due to clamping for positioning the patterning device 10. The patterned surface 11 may also have a convex shape, for example due to gravity (not illustrated). The actual shape of the patterned surface 11 may vary over the surface. This means that the surface shape may differ from one location to another—local surface shape. In addition, the surface deformation in x-direction may differ from the surface deformation in the y-direction.

FIGS. 2B and 2C depict the effect of a patterning device 10 with a curved patterned surface 11 for a transmissive and a reflective patterning device, respectively. In these examples, a concave shaped surface interacts with a first radiation beam 12, for example exposure radiation B. Note: the effect is not limited to concave shaped surfaces. The surface may have any shape as mentioned above. As illustrated, the first radiation beam 12 is deflected from the ideal radiation path 13 due to the curvature of the patterned surface 11, resulting in a radiation path illustrated by a second radiation beam 14. This may lead to a position shift and or a focus shift of the second radiation beam with respect to the ideal radiation path 13. A transmissive or a reflective patterning device may be used for exposures with DUV or EUV radiation, respectively.

Exposure radiation propagating via a path deviating from the ideal radiation path 13 may result in a shifted and or distorted pattern projected at the substrate W. Hence, the surface shape of the patterning device 10 may introduce lithographic errors and herewith affecting the IC features, in case no counter measures are provided.

Figure 3:
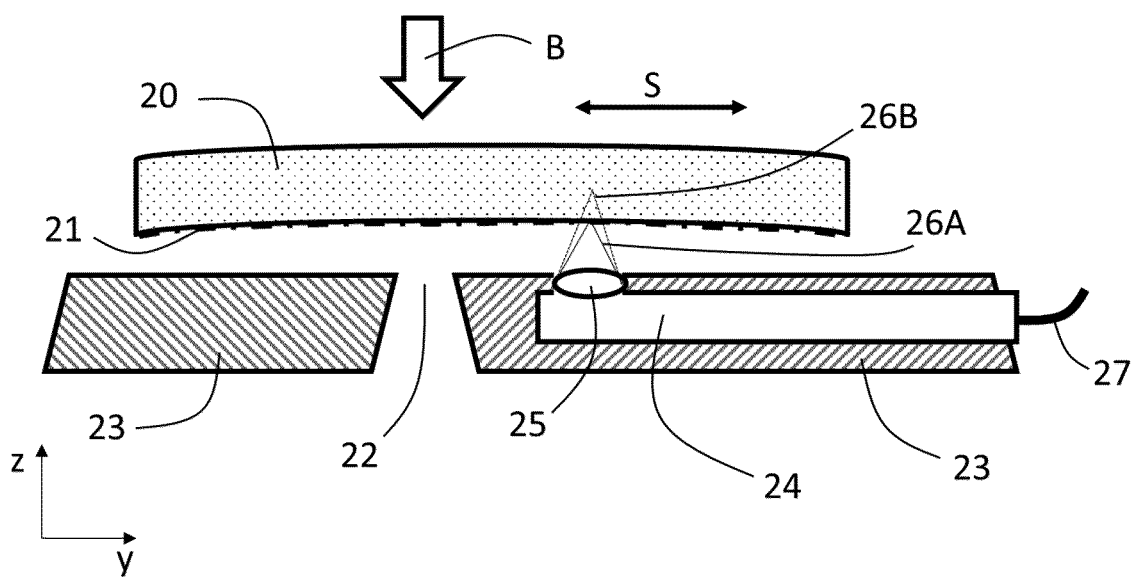
FIG. 3 illustrates an embodiment of the invention.

FIG. 3 illustrates a first embodiment of the invention. A patterning device 20 is positioned above a lens top plate 23 (for example, above the projection system PS) and arranged to move with respect to a slit area 22 (as illustrated by an arrow S), through which radiation beam B may pass (for example during exposures). At the lens top plate 23, a chromatic confocal sensor 24 is positioned. The chromatic confocal sensor 24 comprises a chromatic lens 25, for example a hyperchromatic lens, that may provide a strong chromatic aberration to radiation that interacts with the chromatic lens 25. Such a chromatic lens 25 has the advantage that radiation comprising different wavelengths is focused at different distances from the chromatic lens 25. Providing radiation with multiple wavelengths, for example provided by a broadband radiation source, to the chromatic confocal sensor 24 may cause the multiple wavelengths to focus at different axial distances from the chromatic lens 25, as illustrated by focus lines 26A and 26B in FIG. 3. The chromatic lens 25 may focus radiation with a first wavelength at the patterned surface 21 of the patterning device 20, as illustrated by first focus lines 26A. Radiation with a second wavelength may not have its focus at the patterned surface 21, as illustrated by second focus lines 26B.

The chromatic confocal sensor 24 may be embedded in the lens top plate 23, as is illustrated by FIG. 3. In another embodiment, the chromatic confocal sensor 24 may be positioned at a surface of the lens top plate 23.

The top plate 23 may be provided with one or more chromatic confocal sensors 24.

In another embodiment, the chromatic confocal sensor 24 may be provided at a frame different from the lens top plate 23, for example a frame configured to support the first positioner PM or a frame arranged between the projection system PS and the patterning device MA. The frame may be provided with one or more chromatic confocal sensors 24.

A channel 27 may comprise one or more optical fibers to provide radiation from a radiation source, for example a broadband radiation source, to the chromatic confocal sensor 24.

The chromatic confocal sensor 24 may comprise a plurality of optical elements. These optical elements may include lenses, mirrors, beam splitters, filters, and or prisms.

Figure 4:
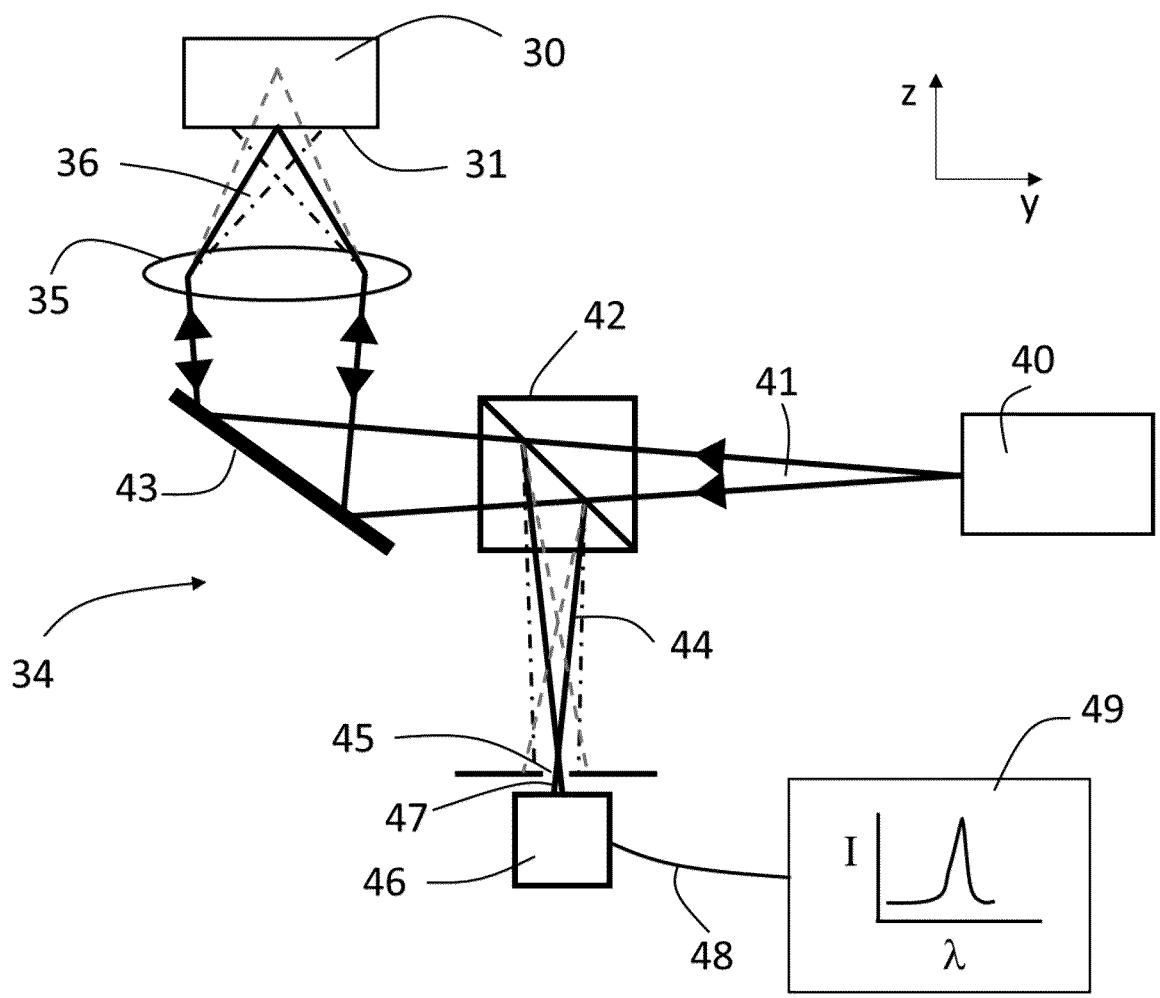
FIG. 4 depicts a schematic layout of a chromatic confocal sensor that may be used in an embodiment of the invention.

FIG. 4 illustrates in more detail the functionality of the chromatic confocal sensor 24 that may be provided at the lens top plate 23, as illustrated in FIG. 3, or at a frame. Chromatic confocal sensor 34 may receive radiation from a radiation source 40, which is configured to provide measurement radiation 41 of multiple wavelengths. The multiple wavelength radiation 41 may be provided by an ex-situ light source and may be guided towards the chromatic confocal sensor 34 via an optical channel, for example an optical fiber or an arrangement of optical elements (e.g., lenses and mirrors). In an alternative configuration, the radiation source 40 may be arranged in the chromatic confocal sensor 34. Radiation 41 may be provided by the radiation source 40 to interact a first time with an optical beam splitter 42. Different optical elements, e.g., lenses and or mirrors, may be provided between the radiation source 40 and the beam splitter 42. An optical element 43, for example a mirror, may be positioned in the optical path to guide the radiation towards a (hyper)chromatic lens 35. Due to the chromatic character, i.e., axial chromatic dispersion, of the chromatic lens 35, each wavelength of radiation interacting with the chromatic lens 35 has a different focal length. The chromatic lens 35 may be arranged to project the multiple wavelength radiation 41 onto a target 30. Projection lines 36 illustrate the chromatic character of the chromatic lens 35, with each focus line 36 representing a radiation path of radiation with a different wavelength. A portion of the target, for example an interface or a surface 31 of the target 30, may be at a first focal plane of the chromatic lens 35. The measurement radiation, which is focused at the portion of the target 30, comprises measurement radiation with a single wavelength or measurement radiation with a narrow spectral range.

A portion of the projected radiation may be reflected by the target 30. At least a portion of the reflected radiation is collected by the chromatic lens 35. Due to the confocal arrangement of the sensor 34, solely the radiation that was focused at the target interface or surface 31 will pass a confocal aperture 45 arranged at a second confocal plane of the chromatic lens 35. The confocal aperture 45 may be arranged in front of a spectrometer 46. The spectrometer 46 may be positioned near a second focal plane of the chromatic lens 35 to receive at least a portion of the reflected radiation 44. By means of the spectrometer 46, which commonly comprises a grating, a lens arrangement, and an array detector, spectral information of at least a portion of the reflected radiation 44, which is received (received radiation 47) by the spectrometer 46, is determined.

The spectrometer 46 may provide a signal 48 comprising spectral information of the received radiation 47, i.e., the reflected and returning radiation that passes through the confocal aperture 45 after interaction with the target 30. The spectral information may be intensity data of each wavelength of the received and measured radiation 47. By acquiring the spectral information of the received radiation 47, axial distance information (or depth) of the target 30 with respect to the chromatic lens 35 is obtained without mechanically (re)positioning the lens 35 relatively to the target 30. This has the advantage that the confocal sensor 34 does not require moving parts to ensure that the focus position of the radiation, which is used to measure the axial distance, is at the surface or interface 31 of the target 30.

The chromatic confocal sensor 34 may comprise (additionally) one or more optical components, for example lenses and mirrors to steer, to guide, and or to shape the radiation beam.

The multiple wavelength radiation 41 may be provided by a broadband radiation source, for example a white-light source. The multiple wavelength radiation 41 may also be provided by multiple radiation sources each providing measurement radiation with a narrow spectral range, for example each with a wavelength range (or bandwidth) of 1-10 nm, and herewith forming a radiation source 40 with a wide spectral range. Each multiple radiation source may be a laser or a LED, or alike. The different measurement radiation beams may be combined by means of an optical combiner.

The measurement range and the measurement accuracy of the chromatic confocal sensor 34 is governed by the spectral range of the provided radiation 41 as well as the amount of axial chromatic dispersion of the (hyper)chromatic lens 35. This means that the skilled person may select specific wavelengths, wavelength ranges, and or chromatic lenses for optimizing the sensor performance. For example, with a measurement range of 0.1-0.3 mm the chromatic confocal sensor 34 may obtain a measurement resolution of approximately 10 nm.

A person skilled in the art will appreciate that, for example, a lens top plate 23 comprising a chromatic confocal sensor 34 may enable axial position, or axial distance, measurements of a patterning device 20 that is positioned within the measurement range of the chromatic confocal sensor 34. Furthermore, during a scanning movement of the patterning device 20 (for example a scan movement in a first and or second direction), for example during an exposure of a substrate W, a position (in a third direction, e.g., z-direction) or depth scan over the surface of the patterning device 20 can be made by means of the chromatic confocal sensor 34.

The chromatic confocal sensor 34 may also be arranged at a support different than the lens top plate 23. It may be arranged at a stage that supports the patterning device 20, but which is not a moving part during exposures. The chromatic confocal sensor 34 may be arranged at a frame near the patterning device.

The spectral information provided by the spectrometer 46 may be illustrated by the schematic graph 49 depicted in FIG. 4. The spectral information may comprise information of the radiation intensity per wavelength. The wavelength may be seen as a ruler for measuring the distance between the chromatic lens 35 and the target 30, for example a patterning device 20, MA—axial position or distance of the target. In addition, the received intensity (spectral intensity information) may provide a measure for the (local) reflectivity of the surface 31 at the focus position (first focal plane) of the received radiation 47.

In addition to radiation with a wavelength that is focused at the surface 31 of the object 30, and which in turn is measured by the spectrometer 46, radiation with different wavelengths may be measured by the spectrometer 46. That is, depending on the chromatic dispersion of the chromatic lens 35 as well as the size of the aperture 45, radiation with a wavelength different from radiation that is focused at the first and second focal plane may impinge the spectrometer 46. This may result in a (spectral) background signal. By means of a (hyper)chromatic lens 35 with a relatively high chromatic dispersion and or with a relatively narrow aperture 45, this background signal may be suppressed. Even with a (spectral) background signal, the received spectral intensity information may be used to characterize the object 30. That is, intensity peaks in the recorded spectrum may provide a measure for characterizing the surface of the object of interest.

A controller may be used to control one or more chromatic confocal sensors 34 or to control a measurement apparatus comprising one or more chromatic confocal sensors 34. This may include control over the radiation source 40 and the spectrometer 46. The same controller or a different controller may be used to change the position of the patterning device 20 relatively to the one or more chromatic confocal sensors 34.

A processor may be used to process the spectral information provided by the signal 48. The processor may be configured to receive (relative) position information in order to correlate the measured spectral information with a position or location at the patterning device 20 within a system or apparatus. This may include the axial distance between a surface of object 30 (or patterning device 20) interacting with the measurement radiation and the chromatic lens 35.

Figure 5:
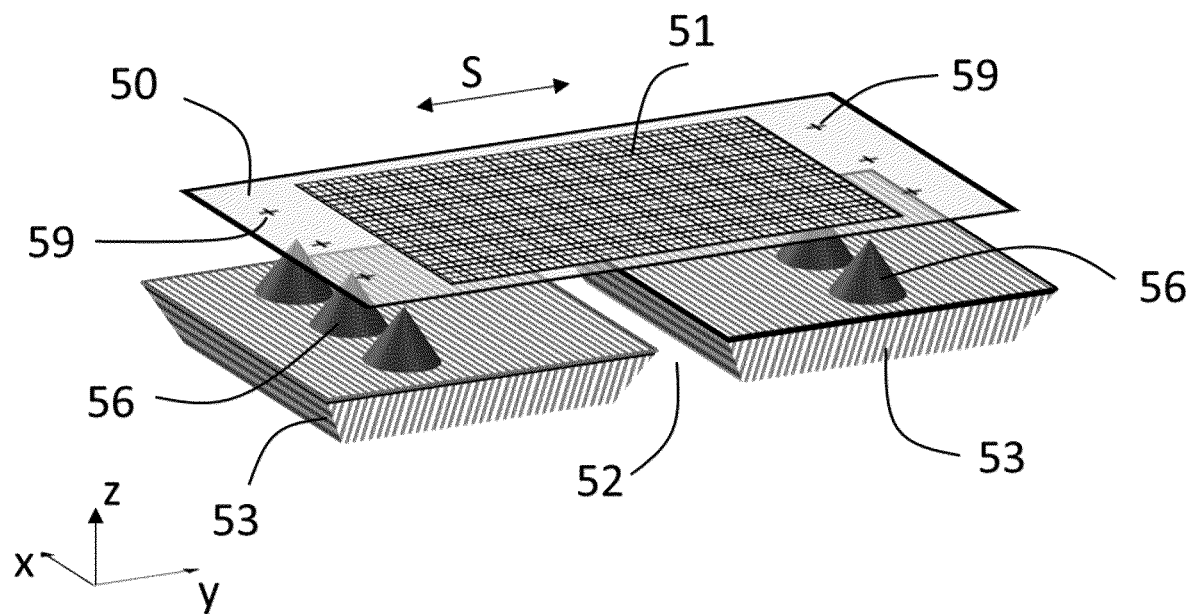
FIG. 5 depicts a schematic illustration of an embodiment of the invention.

FIG. 5 depicts a schematic illustration of an embodiment of the invention. A support 53, for example a lens top plate 23, may comprise more than one chromatic confocal sensors configured to provide more than one measurement radiation beams 56. Note: the more than one chromatic confocal sensors are not illustrated in FIG. 5, for clarity. For example, the more than one chromatic confocal sensors may be arranged in one or more arrays. A first array of chromatic confocal sensors may be arranged at a first portion of the support 53 at one side of the slit area 52, and a second array may be arranged at a second portion of the support 53, for example, at an opposite side of the slit area 52. FIG. 5 illustrates two exemplary arrays, each array formed by three chromatic confocal sensors and indicated by the arrays of radiation cones 56. The number of chromatic confocal sensors per array, as well as the number of arrays, may differ from the number as exemplary illustrated by FIG. 5. One may consider to arrange, for example, five or seven chromatic confocal sensors per array. Less or more chromatic confocal sensors may be arranged in each sensor array. Each sensor array may be configured to measure a plurality of axial distances to a patterned device 50.

The patterning device 50 may comprise a patterned surface 51 that may be positioned opposite to, or in the field-of-view of, at least one chromatic lens of a chromatic confocal sensor, for example, the chromatic confocal sensor 24, 34 as illustrated in FIGS. 3 and 4. Herewith, multiple wavelength radiation projected by the at least one chromatic lens may impinge the patterned surface 51 of the patterning device 50. Preferably, at least one chromatic confocal sensor may be arranged such that the radiation spot of the at least one chromatic confocal sensor may impinge or may interact with an area on the patterning device 50 comprising metrology patterns 59, for example the mask alignment marks M1, M2. Metrology patterns 59 are typically measured by a parallel lens interferometer, for example arranged at a wafer stage or a metrology stage, to measure a shape and or a position of the patterning device 50. Measuring the same area (or pattern) by means of a first measurement system comprising, for example, an interferometer (i.e., an interferometric measurement system) and a second measurement system comprising chromatic confocal sensors, may be advantageous to calibrate and or to correlate both measurement systems.

For example, the patterning device 50 may have a barrel shape. This barrel shape may be measured by both first and second measurement systems, which may be used to calibrate one system to the other.

It may also be beneficial, in cases where portions of the pattern device 50 are not measured by one of the first and second measurement systems to provide the missing information by using data of the other measurement system to obtain a complete measurement data set. This may not be limited to areas that may be measured by both measurement systems. The first measurement system may be limited to measurements at the areas comprising the metrology patterns 59, whereas the second measurement system may measure areas comprising the metrology patterns 59 as well as areas between the metrology patterns 59. Herewith, not only both systems may be calibrated, also shape and position information of areas that are typically not measured by common measurement systems is received. An improved (shape) model of the patterning device 50 may be obtained.

The patterning device 50 may be moved relatively to the array of chromatic confocal sensors, as illustrated by the arrow S in FIG. 5. Herewith, the patterned surface 51 of the patterning device 50 facing the sensor array may be scanned. Based on the received spectral information as a function scan-position of the patterning device with respect to the sensor array, spatial information of the patterning device 50, e.g., a surface height map as well as a surface density map at the patterned surface 51 of the patterning device 50, may be obtained.

Figure 6:
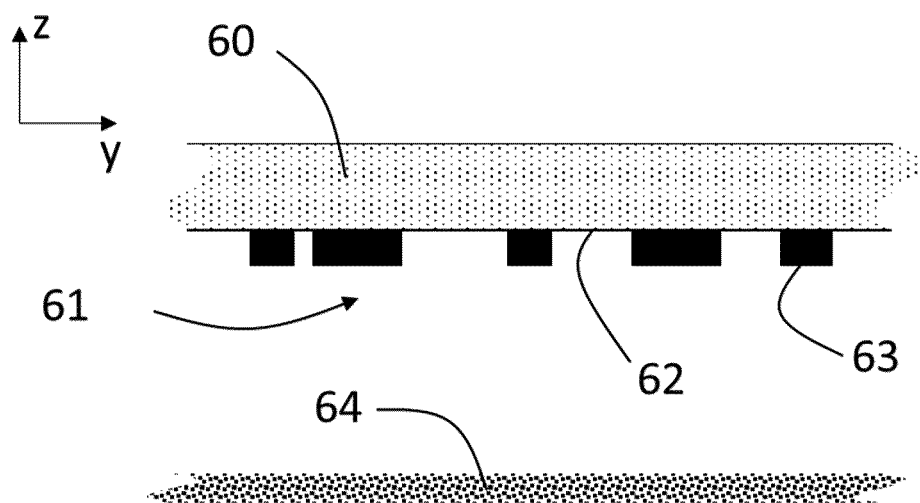
FIG. 6 depicts a schematic cross-section of a patterning device.

FIG. 6 depicts a magnification of a schematic cross-section of a patterning device 60 comprising a patterned surface 61. The patterned surface 61 may comprise a patterned layer 63 that comprises chrome or another radiation absorbing material, provided on a surface 62 of supporting material, for example a quartz material. The patterned layer 63 may have a thickness typically in the order of 100 nm. Thus, the portions of the patterned layer 63 may be considered as areas with a height of approximately 100 nm provided on, for example, bare quartz material.

With a chromatic confocal sensor that has a measurement range of 0.1-0.3 mm and a measurement accuracy of approximately 10 nm, height steps in the order of 100 nm may be resolved. That is, first radiation with a first wavelength reflected at, for example, bare quartz material, may be received by the spectrometer 46. Second radiation with a second wavelength reflected at a patterned layer portion 63 (for example a chrome portion) may also be received by the spectrometer. Both first and second radiations may be graphically displayed. Two peaks may be presented by the graph 49, with a first peak at the first wavelength and a second peak at the second wavelength. Hence, multiple wavelength radiation that interacted with different portions of the patterned device 60 will have different spectral recordings, each corresponding to a specific portion. Herewith, the different portions may be spectrally distinguished. The wavelength difference between the first wavelength and the second wavelength, as recorded, is a measure of a difference in the axial position (axial distance) between, for example, a quartz portion 62 and a portion of the patterned layer 63. This means that a local thickness of the patterned layer 63 may be measured.

In some occasions the patterning device 60 may be provided with a (partially) transparent pellicle membrane 64, wherein the pellicle is arranged facing the patterned surface 61 to prevent contamination to settle on the patterned surface 61. Instead, contaminating particles may settle on the pellicle membrane 64. The pellicle membrane 64 may be provided to the patterning device 60 by means of a frame (not illustrated in FIG. 6). Typically, the pellicle membrane 64 is arranged a few millimetres from the patterning surface 61, such that the pellicle membrane 64 is out of the focal plane of the patterning device 60. Herewith, reducing the impact of particles during exposure.

Figure 7:
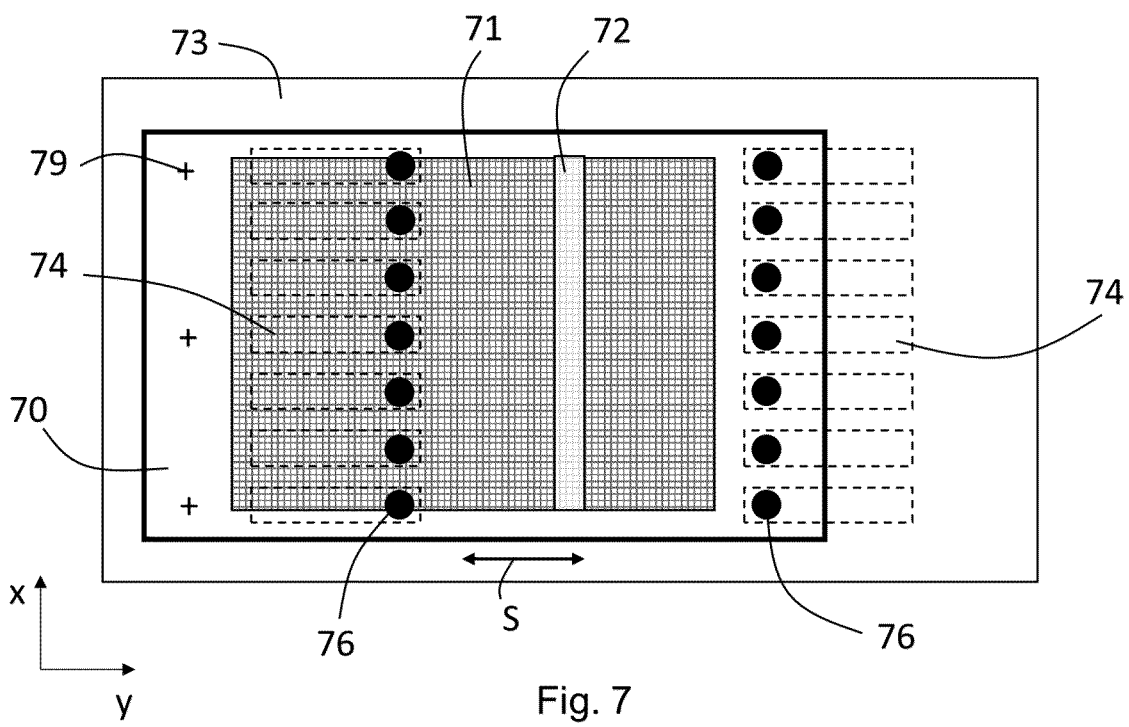
FIG. 7 illustrates an embodiment of the invention.

An embodiment of the invention is illustrated by FIG. 7. A support 73 is provided with one or more chromatic confocal sensors 74, as disclosed in FIG. 4. In one embodiment, a plurality of chromatic confocal sensors 74 is arranged in an array configuration, herewith forming a sensor array (e.g., as illustrated in FIG. 5). Each of the chromatic confocal sensors may be configured to provide a radiation cone 76 to interact with a patterning device 70 that may be provided at a focal plane of at least one confocal lens of the sensor array 74. The patterning device 70 may be held on a mask support MT, which is configured to move the patterning device 70 in at least one direction, for example the y-direction as illustrated by the arrow S. Herewith, the patterning device 70 may move relatively to the sensor array 74, such that the area of the patterning device 70 that interacts with the radiation, which is provided by the chromatic confocal sensors 74, changes by the relative movement. During the relative movement, the radiation spot of at least one chromatic confocal sensor arranged in the sensor array 74 impinges the patterned surface 71 of the patterning device 70. Herewith, the patterned surface 71 is scanned and measured along the direction of the relative movement (illustrated by the arrow S). By means of the plurality of chromatic confocal sensors 74, the patterned surface 71 may be measured at different surface positions at the same time. This may be advantageous to minimize the measurement time and or to increase the spatial surface position information, e.g., surface information density and surface curvature.

In one embodiment, the sensor array 74 may be configured to form a single line-array of sensors provided at a single side of a slit area 72. The line-array of sensors may be configured such that the line-array is arranged perpendicular to the scan direction. For example, the line-array may be arranged along the x-direction. The line-array may also be arranged in a direction forming an angle between 45 and 90 degrees with respect to the scan direction. Herewith, the whole surface of the patterning device, or a portion thereof, may be scanned in one scan (or stroke).

By measuring the axial distance as a function of spatial position, for example as a function of a position within a two-dimensional plane, preferably in a (xy-)plane approximately parallel to the surface of the patterning device 70, a height map or surface topography map of the patterning device 70 may be obtained. From this map a local and or global shape of the patterning device 70 may be determined.

During operation of the lithographic apparatus LA, the patterning device 70 makes a scanning movement with respect to the slit area 72 (illustrated by the arrow S). Typically, the stroke of this movement is determined by the area of the patterned surface 71 and the locations of the metrology patterns 79 at the patterning device 70. Since the slit area 72 and the sensor array 74 are spatially separated, the patterning device 70 needs to move beyond the movement window as typically used during system operation (e.g., during exposure) to ensure that the sensor array 74 is able to measure both the area comprising the patterned surface 71 and the metrology patterns 79. Not to extend the movement window significantly beyond the window as typically used during system operation, the sensor array 74 (comprising a plurality of chromatic confocal sensors) may be configured by a double sensor array comprising a first and a second sensor array. For example, the first sensor array may be arranged at one side of the slit area 72 and the second sensor array may be arranged at a second side of the slit area 72, for example, an opposite side of the slit area, as exemplary illustrated by FIG. 7. Herewith, first sensor array may measure a first portion of the patterning device 70 and second sensor array may measure a second portion of the patterning device 70. The first and second portion of the patterning device 70 may be chosen in such a way to cover the area of interest.

In addition, when the first portion and the second portion at least partially overlap, the overlapping part may be used to calibrate first and second sensor arrays to each other. Herewith, also to ensure that the area of interest is measured completely by the sensor array 74.

The sensor array 74 may be arranged in a way such that the radiation spot 76 of one or more chromatic confocal sensors is configured to interact with one or more metrology patterns 79, M1, M2 provided at a patterning device 70 when held on a mask support MT. Measuring the same area, for example the same metrology pattern, by means of a first measurement system comprising an interferometer (i.e., an interferometric sensor) and a second measurement system comprising chromatic confocal sensors 74, may be advantageous to calibrate and or to correlate both measurement systems.

Figure 8A:
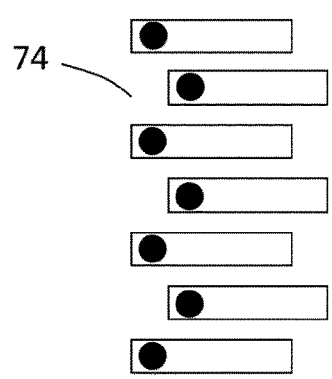
FIGS. 8A, 8B, and 8C illustrate different sensor array configurations according to the invention.

The sensor array 74, as illustrated in FIG. 7, may be arranged as a linear array. Alternatively, the sensor array 74 may have an alternating sensor layout as depicted in FIG. 8A. This may be advantageous to avoid optical cross-talk between neighbouring sensors. That is, radiation projected by a first chromatic lens may be scattered at a surface of the target (patterning device) and received by a second chromatic lens, for example, a neighbouring lens. This may result in an incorrect analysis of the spectral intensity information.

Figure 8B:
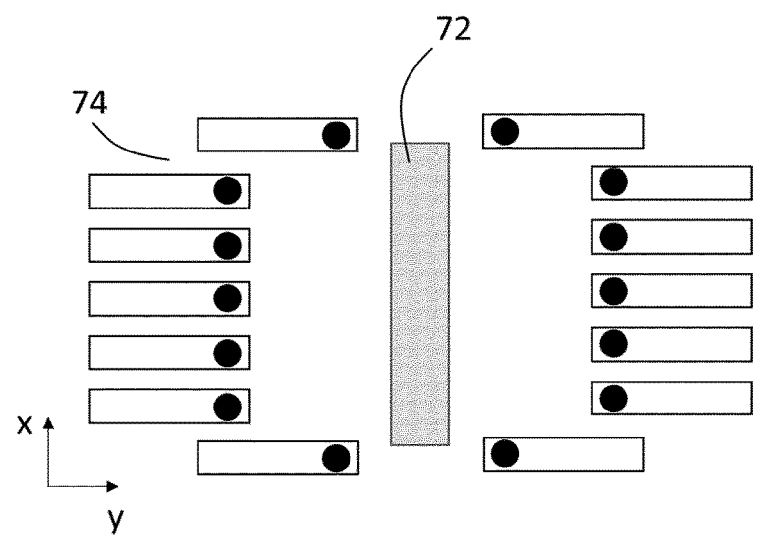

In another embodiment, the chromatic confocal sensors positioned at the outer sides of a sensor (line) array 74 are shifted with respect to the central chromatic confocal sensors, as illustrated by FIG. 8B. Such a sensor array configuration may be used, for example, to match the metrology pattern layout at the surface of the patterning device. That is, occasionally metrology patterns are positioned along the long side of the exposure field of the patterning device.

The sensor arrays as illustrated by FIGS. 7, 8A, and 8B may comprise chromatic confocal sensors arranged equidistant with respect to each other. Herewith, forming an array of sensors with a single pitch. With an equidistant arrangement, surface information may be obtained with spatial uniformity.

In another embodiment, the sensors may be arranged not equidistant. The sensors may be arranged with variable pitch within the array. This may be beneficial in situations when surface information of a first area need to be more dense than at a second area.

Figure 8C:
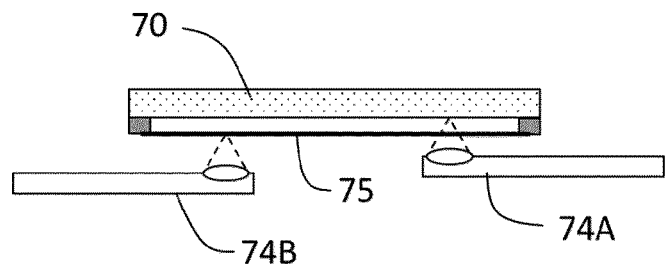

FIG. 8C illustrates another embodiment according to the invention. According to the invention, the sensor array may comprise a first sub-array 74A and a second sub-array 74B. The first sub-array 74A may be arranged such that the patterned surface of the patterning device 70 is at a focal plane for a chromatic lens arranged in the first sub-array 74A. The second sub-array 74B may be arranged such that a pellicle membrane 75 provided at the patterning device 70 is at a focal plane of a chromatic lens arranged in the second sub-array 74B. Because of the stand-off distance between the patterning device 60, 70 and the pellicle membrane 64, 75, which is typically a few millimetres, the pellicle membrane is not within the working-range of the first sub-array 74A. The same counts for the patterning device 60, 70, which will be outside the working-range of the second sub-array 74B. Since the pellicle membrane is (partly) transparent, the first sub-array is able to sense the surface of the patterning device 70 with minor or negligible impact of the pellicle membrane 75. This embodiment, as illustrated in FIG. 8C, has the advantageous that position and shape measurements by means of the sensor array 74 may be performed for the patterning device 70 as well as for the pellicle membrane 75 at the same time.

A person skilled in the art will appreciate that a position of a first chromatic confocal sensor at a support, e.g., the lens top plate (23, 53), may be changed. For example, one or more mutual distances between sensors arranged as a sensor array, as well as the distance between the patterning device and sensor array, may be changed in order to optimize the measurement and or to tailor the sensor array for the area of interest.

Figure 9A:
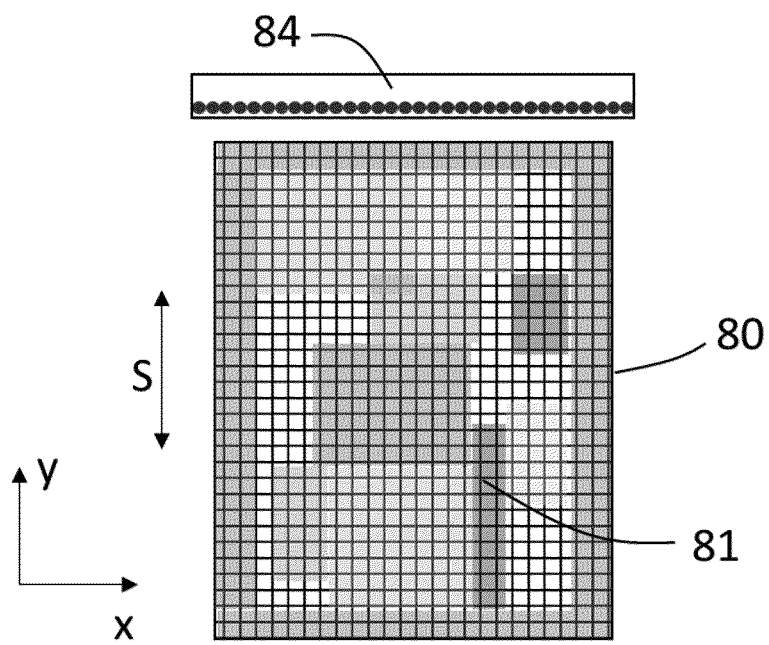
FIG. 9A illustrates a patterning device comprising a non-uniform material layer density.
Figure 9B:
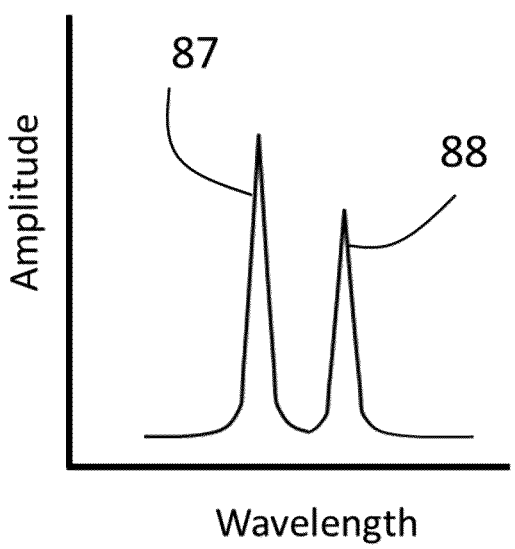
FIG. 9B depicts a schematic graph illustrating spectral recordings of radiation received by a chromatic confocal sensor.

FIG. 9A illustrates a patterning device 80 comprising a patterned area 81. The patterned area 81 may, for example, comprise a non-uniform absorption layer or a non-uniform chrome layer as illustrated by the grayscale variation over the patterned area 81. When measuring at the patterned surface 81 by means of chromatic confocal sensors, multiple wavelengths may be received and detected by a spectrometer, as illustrated by the two peaks in the graph depicted by FIG. 9B. The actual number of recorded peaks is determined by the material composition and or layer configuration. Thus, more than two peaks may be recorded. In this example, a first peak 87 may correspond to the radiation that has interacted with, for example, a patterned chrome layer 63, and a second peak 88 may correspond to the radiation that has interacted with a supporting material 62, for example quartz material. Recordings of the first peak 87 and the second peak 88 are due to the axial dispersion length of the chromatic lens. The spectral difference between the peaks is a measure for the local thickness of the patterned layer 63. Both (portions of the) patterned layer 63 and (portions of the) supporting material 62 may be measured, since the focus spot of the measurement beam is typically of finite size. That is, the actual spot size of the multiple wavelength radiation beam interacting with an object determines the measured area. Depending on the spot size, different material portions, and thus different materials, may interact with the measurement radiation, which may result in more than one intensity peak as illustrated by FIG. 9B.

Since the spot of the radiation provided by the chromatic lens has a finite size, the measured intensity is determined by the (averaged) reflectivity of the area within the radiation spot. This means that the amplitude of a peak may be a measure for a local material density. During a scan over the patterned surface 81 one or more peaks may vary in amplitude. By comparing the relative amplitudes (the measured amplitude corresponds to a position at the measured object) one may obtain information about the local material density and the variation thereof. The spot size may determine the spatial sensitivity of the sensor. And herewith, the spatial resolution may be governed by the spot size.

A sensor array 84 comprising a plurality of chromatic confocal sensors, for example chromatic confocal sensors conform the sensor as illustrated by FIG. 4, may be used to obtain surface information of the patterning device 80 at high spatial resolution. Hence, a two-dimensional material density map may be obtained. Information about the local and global material density may in turn be used to calculate the local and global transmissivity, reflectivity, and or absorption of the patterning device 80. Herewith, a two-dimensional map of optical properties of the patterning device 80 may be generated.

Instead of deriving the pattern distribution using a mask design file, e.g., a GDSII file, one may obtain the required material density map during an (pre-)exposure sequence (in-situ). That is, during an exposure step the patterning device 80 held by a support, e.g., a mask support T, moves relatively to the sensor array 84. By recording the reflected and received radiation, as provided by the one or more chromatic confocal sensors, a density map may be obtained in parallel with the exposure. The density map may also be determined by surface information obtained at a moment before an exposure step. In both cases, the density map may be used in a feedforward control to define and to set exposure characteristics, e.g., (local) intensity of the exposure radiation B and or lens settings of the projection system PS.

The sensor array 84 may be a sensor array 74 according to FIGS. 7, 8A, 8B, and 8C.

An lithographic apparatus, e.g., the lithographic apparatus LA as illustrated in FIG. 1, comprising the chromatic confocal sensor or the array of chromatic confocal sensors according the invention, may use the sensors at various stages during an exposure sequence. This may be before, during, and or after the exposure sequence.

At a first stage of an exposure sequence, for example before a substrate W is illuminated by patterned radiation, the chromatic confocal sensor (array) may be used to measure an initial shape and or initial optical properties of the patterning device MA. At a start of a wafer lot, exposure radiation B may not yet have interacted with the patterning device MA. Hence, the patterning device may be considered as (relatively) cold. The first or initial measurement may provide information representing a cold-shape of the patterning device MA.

At a second stage of an exposure sequence, for example after a first exposure or a series of exposures, a second measurement may be performed providing a secondary shape and or secondary optical properties of the patterning device MA. After interaction with the exposure radiation B, the patterning device MA may be heated due to the exposure radiation B. Hence, the patterning device is in a heated (or warm) state. Herewith, the second measurement provide information representing a heated-shape of the patterning device MA.

Information obtained by the first and or second measurement may be used to calculate shape changes of the patterning device MA as a function of time (transient behaviour) as well as exposure sequence. A finite element method may be used to model the properties of the patterning device MA, by using the shape measurement results as an input for the model. The model may be a reticle heating and or a lens heating model. An output of the model may comprise instructions regarding positioning of optical elements within the projection system PS, e.g., position and orientation of lenses and or mirrors arranged in the projection system PS, as well as the arrangement of the patterning device MA.

Reticle heating may induce deformation of the patterning area, typically indicated as a XY-grid distortion, which may vary in time. Knowledge of the surface parameters of the patterning device, including optical properties (e.g., reflectivity, transmissivity, and absorption) and surface curvature (axial distance), may be used to determine adjustments to the position of the patterning device MA, by applying a translation (for example in the x, y, and or z-direction), and the orientation of the patterning device MA, by applying a rotation (for example an Rx rotation and or an Rz rotation) to at least partially compensate the distortion.

Information representing the cold-shape and the heated-shape of the patterning device MA, or the difference between both, may be used for shape compensation by means of the mask support MT. The mask support MT may be actively controlled to compensate the exposure-induced shape change. This may be done by moving the patterning device MA, for example, in the z-direction, and or by providing an Rx rotation and or an Ry rotation.

Information representing the cold-shape and the heated-shape of the patterning device MA, or the difference between both, may be used for shape compensation by means of a reticle bender using a mechanical load applied to the patterning device MA.

Figure 10:
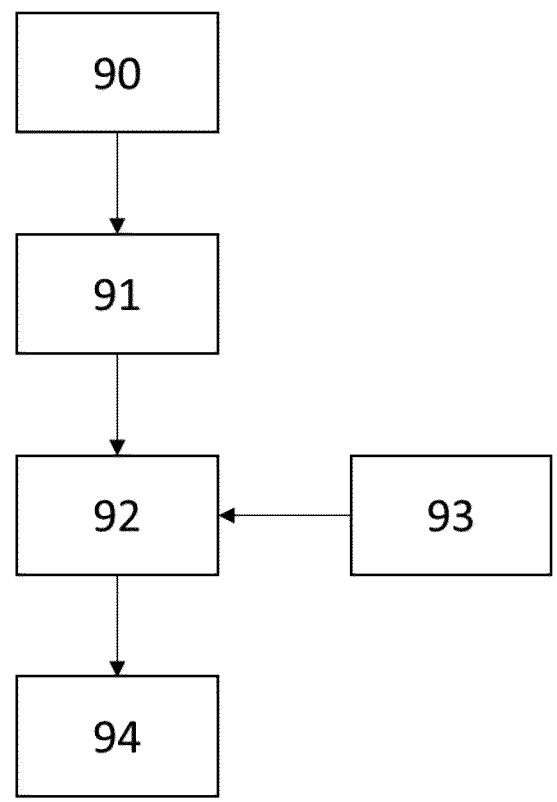
FIG. 10 schematically illustrates a method for compensating reticle heating.

FIG. 10 illustrates a method for, for example, compensating heating of the patterning device MA (also known as reticle heating) based on information of the pattern density at the patterning device MA within a lithographic apparatus LA. At a first step 90, an array of chromatic confocal sensors, for example the sensor array 84 as illustrated by FIG. 9A, scans a surface of the patterning device, preferably the surface comprising the patterned surface 81. Herewith, surface position information of the scanned surface may be obtained. Surface position information may be obtained by means of a single scan, but multiple scans could be beneficial to improve the measurement accuracy. At a second step 91, based on the surface position information (obtained at the first step 90) a surface density map is calculated. The surface density map may comprise spatial distribution of the absorber and or reflective layer at the patterning device MA. At a third step 92, the surface density map is combined with information of the (expected) exposure setting 93. Especially, the dose and illumination setting of the exposure radiation (e.g., radiation beam B) is used at the third step 92. The surface density map is used to estimate the reflectivity and or transmissivity of the patterning device MA and or absorption by the patterning device MA when interacting with the exposure radiation. This may be based on a local and or a more global pattern density of the absorber and or reflective layer. Herewith, an exposure induced reticle heating effect may be calculated. The reticle heating effects can be characterized by optical aberrations, including shape deformations of the patterning device MA. Expected shape deformations may be calculated by means of a thermo-mechanical model of the patterning device. For reflective patterning devices MA that are, for example, to be used in EUV lithography systems, the surface density map may be used to estimate the reflectivity and absorption of the patterning device MA. At a forth step 94, the expected reticle shape effect that may include reticle heating is forwarded to a correction model, for example a lens model. The correction model may be used to define lens settings within the projection system PS to compensate for expected optical changes of the patterning device MA. Optical compensations may be accomplished by means of (semi)active optical elements, for example lenses and or mirrors. This may include a correction model for reticle heating that is used to compute offsets to exposure scan trajectories of lens and stages.

Optical elements, which may be transmissive or reflective elements, within the projection system PS are typically configured to be adjusted. Herewith, optical aberrations within the optical path that is used during exposure of a substrate may be changed or compensated by adjusting one or more settings of the optical elements. This may be done via position and or orientation changes of these elements, or by changing the refractive index of the transmissive element.

A processor may be used to steer and to perform each individual step as illustrated by FIG. 10. The processor may be part of the lithographic apparatus LA. The processor may be at a remote location.

The required optical compensations may be accomplished by means of (semi)active reticle manipulation. For example, by shaping the reticle by means of a reticle bender.

In another embodiment, the surface density map of the patterning device, obtained at step 91, may be used as a direct input for the lens model. That is, based on the (local) density information of the patterning device an estimation of the local dose (or radiation density) within the projection system may be made. In turn, this may enable estimating the radiation induced lens heating, for which the lens settings depend on. In other words, knowledge of the projected pattern, based on the received density information, may be used to define the optical lens settings to imply lens heating corrections.

Similar as lens heating, heating of the substrate W (i.e., wafer heating) depends on the local transmission and or reflectivity of the patterning device. The method as illustrated by FIG. 10 may also be used for compensating heating effects at substrate level. In case of wafer heating compensation, at the forth step 94 of the method as illustrated by FIG. 10, an expected substrate shape (for example radiation induced substrate deformation) may be calculated based on the information received at previous steps. The expected substrate shape may be forwarded to a correction model, including for example a lens model. The correction model may be used to define lens settings within the projection system to compensate for expected changes of the substrate W. The optical compensations may be accomplished by means of (semi)active optical elements, for example lenses and or mirrors. This may include a correction model for wafer heating that is used to compute offsets to exposure scan trajectories of lens and stages.

In another embodiment, the method may be used to compensate both reticle and wafer heating effects. It may be beneficial to define in the correction model lens settings that initiate compensations for effects induced by reticle heating as well as by wafer heating.

In reference to the figures above, the slit area may be defined and formed by an additional element or system. That is, the actual slit area is typically not defined by the lens top plate, support, or frame. As illustrated by the figures, the lens top plate, support, or frame may be arranged in conformity with the location of the slit area.

According to an embodiment of the invention, a measurement system for characterizing a patterning device comprising one or more chromatic confocal sensors as described above, may be arranged in a lithographic apparatus. For example, the measurement system is arranged in a lens top plate.

In another embodiment, an inspection apparatus comprising the measurement system according to the invention. The inspection apparatus may be configured to inspect and or to qualify patterning devices. Information obtained by the inspection apparatus, may be provided to another system, for example a lithographic apparatus or an apparatus arranged to manufacture patterning devices. The inspection apparatus may be arranged to interact with the lithographic apparatus (or the manufacturing apparatus) as a stand-alone apparatus or as a supplement to the lithographic apparatus (or the manufacturing apparatus).

Although specific reference may be made in this text to the use of a lithographic apparatus in the manufacture of ICs, it should be understood that the lithographic apparatus described herein may have other applications. Possible other applications include the manufacture of integrated optical systems, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a mask (or other patterning device). These apparatus may be generally referred to as lithographic tools.

Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Aspects of the invention are set out in the clauses below.

1. A method for determining surface parameters of a patterning device, the method comprising the steps of: loading the patterning device onto a mask support, arranged in a lithographic apparatus; positioning the patterning device with respect to a path of an exposure radiation beam using a first measurement system; providing the patterning device at a first focal plane of a chromatic lens, arranged in a second measurement system; illuminating a part of a surface of the patterning device with radiation through the chromatic lens, the radiation comprising a plurality of wavelengths; determining a position of the illuminated part in a first and second direction; collecting at least a portion of radiation reflected by the patterning device through the chromatic lens; measuring at a second focal plane of the chromatic lens an intensity of the collected portion of radiation as a function of wavelength, to obtain spectral information; and determining the surface parameters of the patterning device at the determined position from the spectral information.

2. The method according to clause 1, further comprising: repeating a plurality of times illuminating a part of a surface, determining a position of the illuminated part, collecting at least a portion of reflected radiation, measuring an intensity of the collected portion, and determining the surface parameters, wherein a different part of the surface of the patterning device is illuminated for each repetition, by moving the patterning device relatively to the chromatic lens in at least the first or second direction.

3. The method according to clause 2, further comprising determining a surface parameter map of a patterned area at the patterning device.

4. The method according to clause 2 or 3, wherein surface parameters comprise at least an optical property at the illuminated part.

5. The method according to clause 4, wherein the optical property is at least one of reflectivity, transmissivity, and absorption.

6. The method according to clause 4 or 5, further comprising determining an expected heating effect of the patterning device by using a heating model, with the optical property as an input.

7. The method according to clause 2 or 3, wherein surface parameters comprise at least an axial distance between the illuminated part and the chromatic lens in a third direction.

8. The method according to clause 7, further comprising determining a shape of the patterning device from the axial distance.

9. The method according to clause 7 or 8, further comprising generating a surface topography map of the patterning device using the axial distance as a function of the determined position.

10. A method for patterning device shape compensation, comprising the steps according to clause 8, further comprising adjusting at least one of the position of the patterning device, by applying a translation to the patterning device, and the orientation of the patterning device, by applying a rotation to the patterning device, based on the determined shape of the patterning device.

11. A method for patterning device shape compensation, comprising the steps according to clause 8, further comprising adjusting the shape of the patterning device based on the determined shape by applying a mechanical load to the patterning device.

12. A method for compensating a heating effect of the patterning device, comprising the steps according to clause 5, further comprising: calculating an expected shape change of the patterning device based on the determined surface parameter map and an exposure setting to be used for an exposure of a substrate, to determine an expected heating effect of the patterning device; defining settings of a projection lens by means of a lens model to compensate the expected shape change of the patterning device; and applying the defined settings before and or during the exposure.

13. The method according to clause 12, wherein the heating effect comprises aberrations.

14. A method of imaging a pattern, provided at a patterning device, via projection system onto a substrate under control of data representative of a surface topography map of the patterning device according to clause 9.

15. A lithographic apparatus comprising a measurement system for characterizing a patterning device, the measurement system comprising: a radiation source arranged to provide radiation with a plurality of wavelengths; at least one chromatic lens, arranged in at least one chromatic confocal sensor, configured to illuminate an area of the patterning device with the provided radiation, and wherein the at least one chromatic lens is configured to collect at least a portion of the radiation reflected by the patterning device provided at a first focal plane of the at least one chromatic lens; a detector arranged at a second focal plane of the at least one chromatic lens, wherein the detector is configured to detect at least a portion of the collected radiation and to provide an intensity signal as a function of wavelength in response to the detected radiation; and a processor to determine characteristics of the patterning device at the illuminated area.

16. The lithographic apparatus according to clause 15, wherein a plurality of chromatic confocal sensors are arranged to form an array of sensors.

17. The lithographic apparatus according to clause 15 or 16, wherein the radiation source comprises at least one of a broadband radiation source and a plurality of radiation sources.

18. The lithographic apparatus according to any one of clauses 15 to 17, wherein the characteristics of the patterning device is at least one of an optical property and an axial distance between the patterning device and the chromatic lens.

19. The lithographic apparatus according to clause 16, wherein the array of sensors comprises a first array of chromatic confocal sensors arranged at a first side of a slit area and a second array of chromatic confocal sensors arranged at a second side of the slit area.

20. The lithographic apparatus according to any one of clauses 15 to 17, wherein a first chromatic lens is arranged at a first axial distance from the patterning device and a second chromatic lens is arranged at a second axial distance from the patterning device, with the second axial distance being different from the first axial distance.

While specific embodiments of the invention have been described above, it will be appreciated that the invention may be practiced otherwise than as described. The descriptions above are intended to be illustrative, not limiting. All the described variants embodiments may be combined if this combination is not limited from a technical point-of-view. Thus it will be apparent to one skilled in the art that modifications may be made to the invention as described without departing from the scope of the claims set out below.

The invention claimed is:

1. A method for determining surface parameters of a patterning device, the method comprising:
    positioning the patterning device with respect to a path of an exposure radiation beam using a first measurement system and at a first focal plane of a chromatic lens arranged in a second measurement system;
    illuminating a part of a surface of the patterning device with radiation through the chromatic lens, the radiation comprising a plurality of wavelengths;
    determining a position of the illuminated part in a first and second direction;
    collecting at least a portion of radiation reflected by the patterning device through the chromatic lens;
    measuring, at a second focal plane of the chromatic lens, an intensity of the collected portion of radiation as a function of wavelength, to obtain spectral information;
    determining the surface parameters of the patterning device at the determined position from the spectral information, and
    maintaining a relative position of the chromatic lens with respect to the surface of the patterning device without movement during the measuring when obtaining the spectral information.

2. The method of claim 1, further comprising:
    repeating a plurality of times illuminating a part of a surface, determining a position of the illuminated part, collecting at least a portion of reflected radiation, measuring the intensity of the collected portion of radiation, and determining the surface parameters,
    wherein a different part of the surface of the patterning device is illuminated for each repetition by moving the patterning device relative to the chromatic lens in at least the first or second direction.

3. The method of claim 2, further comprising determining a surface parameter map of a patterned area at the patterning device.

4. A method for compensating a heating effect of the patterning device, comprising:
    the method of claim 3, further comprising:
        calculating an expected shape change of the patterning device based on the determined surface parameter map and an exposure setting to be used for an exposure of a substrate, to determine an expected heating effect of the patterning device;
        defining settings of a projection lens by means of a lens model to compensate for the expected shape change of the patterning device; and
        applying the defined settings before and/or during the exposure.

5. The method of claim 4, wherein the heating effect comprises aberrations.

6. The method of claim 2, wherein the determining the surface parameters comprises at least determining an optical property at the illuminated part.

7. The method of claim 6, wherein the determining the optical property comprises determining at least one of reflectivity, transmissivity, and absorption.

8. The method of claim 6, further comprising determining an expected heating effect of the patterning device by using a heating model, with the optical property as an input.

9. The method of claim 2, wherein the determining the surface parameters comprises determining at least an axial distance between the illuminated part and the chromatic lens in a third direction.

10. The method of claim 9, further comprising determining a shape of the patterning device from the axial distance.

11. The method of claim 9, further comprising generating a surface topography map of the patterning device using the axial distance as a function of the determined position.

12. A lithographic apparatus comprising:
    a measurement system configured to characterize a patterning device, the measurement system comprising:
        a radiation source configured to provide radiation with a plurality of wavelengths;
        at least one chromatic lens, arranged in at least one chromatic confocal sensor, configured to illuminate an area of the patterning device with the provided radiation, and wherein the at least one chromatic lens is configured to collect at least a portion of the radiation reflected by the patterning device provided at a first focal plane of the at least one chromatic lens;
        a detector configured at a second focal plane of the at least one chromatic lens, wherein the detector is configured to detect at least a portion of the collected radiation and to provide an intensity signal as a function of wavelength in response to the detected radiation; and
        a processor configured to determine characteristics of the patterning device at the illuminated area,
    wherein a relative position of the chromatic lens and a surface of the patterning device is constant and need not be changed to detect the portion of the collected radiation.

13. The lithographic apparatus of claim 12, wherein a plurality of chromatic confocal sensors are configured to form an array of sensors.

14. The lithographic apparatus of claim 12, wherein the characteristics of the patterning device are at least one of an optical property and an axial distance between the patterning device and the chromatic lens.

15. The lithographic apparatus of claim 12, wherein a first chromatic lens is arranged at a first axial distance from the patterning device and a second chromatic lens is arranged at a second axial distance from the patterning device, with the second axial distance being different from the first axial distance.

* * * * *